United States Patent
Jang et al.

(10) Patent No.: US 10,861,746 B2
(45) Date of Patent: Dec. 8, 2020

(54) METHOD OF MANUFACTURING A SEMICONDUCTOR DEVICE

(71) Applicant: Taiwan Semiconductor Manufacturing Company, Ltd., Hsinchu (TW)

(72) Inventors: Shu-Uei Jang, Hsinchu (TW); Chen-Huang Huang, Shuishang Township (TW); Ryan Chia-Jen Chen, Chiaya (TW); Shiang-Bau Wang, Pingzchen (TW); Shu-Yuan Ku, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/400,418

(22) Filed: May 1, 2019

(65) Prior Publication Data
US 2020/0176318 A1    Jun. 4, 2020

Related U.S. Application Data

(60) Provisional application No. 62/773,716, filed on Nov. 30, 2018.

(51) Int. Cl.
| H01L 21/8234 | (2006.01) |
| H01L 29/66 | (2006.01) |
| H01L 21/033 | (2006.01) |
| H01L 21/308 | (2006.01) |
| H01L 21/762 | (2006.01) |

(Continued)

(52) U.S. Cl.
CPC .. *H01L 21/823431* (2013.01); *H01L 21/0337* (2013.01); *H01L 21/3086* (2013.01); *H01L 21/76224* (2013.01); *H01L 21/823437* (2013.01); *H01L 21/823468* (2013.01); *H01L 27/0886* (2013.01); *H01L 29/6653* (2013.01); *H01L 29/66545* (2013.01); *H01L 29/66795* (2013.01); *H01L 29/785* (2013.01)

(58) Field of Classification Search
CPC ....... H01L 29/66545; H01L 21/823468; H01L 21/76224; H01L 29/6653; H01L 21/823437
See application file for complete search history.

(56) References Cited

U.S. PATENT DOCUMENTS

| 8,487,378 B2 | 7/2013 | Goto et al. |
| 8,729,634 B2 | 5/2014 | Shen et al. |
| 8,826,213 B1 | 9/2014 | Ho et al. |

(Continued)

FOREIGN PATENT DOCUMENTS

| KR | 20160140321 A | 12/2016 |
| KR | 20180068846 A | 6/2018 |

(Continued)

*Primary Examiner* — Jay C Chang
*Assistant Examiner* — Mikka Liu
(74) *Attorney, Agent, or Firm* — Slater Matsil, LLP

(57) ABSTRACT

A conductive gate over a semiconductor fin is cut into a first conductive gate and a second conductive gate. An oxide is removed from sidewalls of the first conductive gate and a dielectric material is applied to the sidewalls. Spacers adjacent to the conductive gate are removed to form voids, and the voids are capped with a dielectric material to form air spacers.

20 Claims, 18 Drawing Sheets

(51) Int. Cl.
    *H01L 27/088*     (2006.01)
    *H01L 29/78*     (2006.01)

(56) References Cited

U.S. PATENT DOCUMENTS

| | | |
|---|---|---|
| 8,887,106 B2 | 11/2014 | Ho et al. |
| 9,831,346 B1 | 11/2017 | Zang et al. |
| 10,319,627 B2 | 6/2019 | Park et al. |
| 2014/0282326 A1 | 9/2014 | Chen et al. |
| 2016/0351568 A1 | 12/2016 | Chang et al. |
| 2017/0141210 A1* | 5/2017 | Yang ................. H01L 29/66795 |
| 2018/0040695 A1* | 2/2018 | Smith ............. H01L 21/823871 |
| 2018/0166553 A1 | 6/2018 | Lee et al. |
| 2018/0315752 A1 | 11/2018 | Fan et al. |
| 2018/0315840 A1 | 11/2018 | Chui et al. |
| 2018/0331232 A1 | 11/2018 | Frougier et al. |
| 2019/0013390 A1* | 1/2019 | Cheng ................... H01L 29/785 |

FOREIGN PATENT DOCUMENTS

| | | |
|---|---|---|
| KR | 20180121313 A | 11/2018 |
| TW | 201816856 A | 5/2018 |
| TW | 201834145 A | 9/2018 |

* cited by examiner

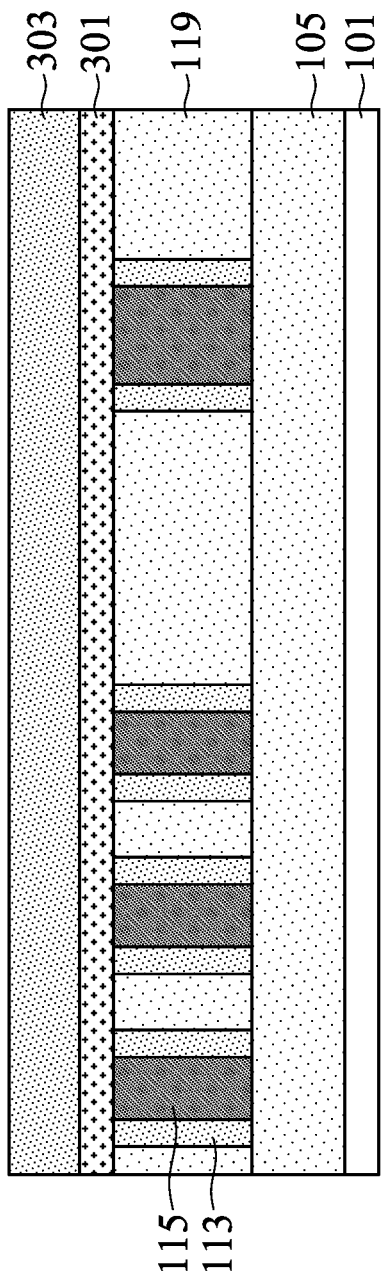
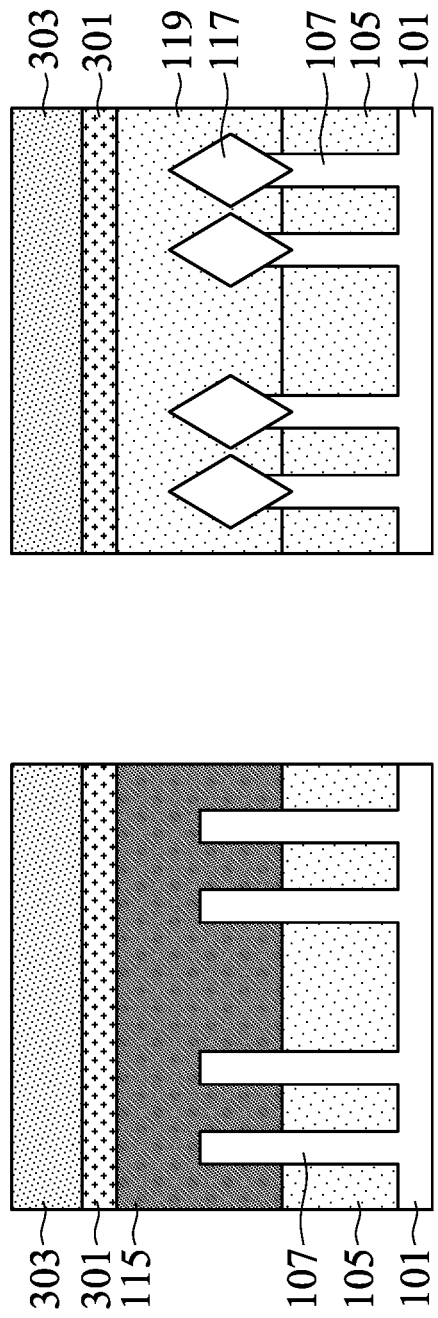
Figure 3A
Figure 3B
Figure 3C

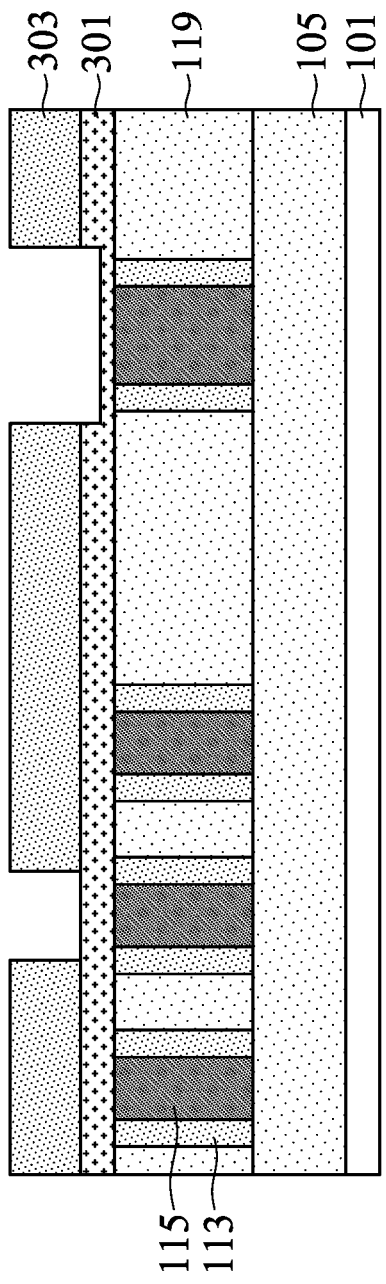
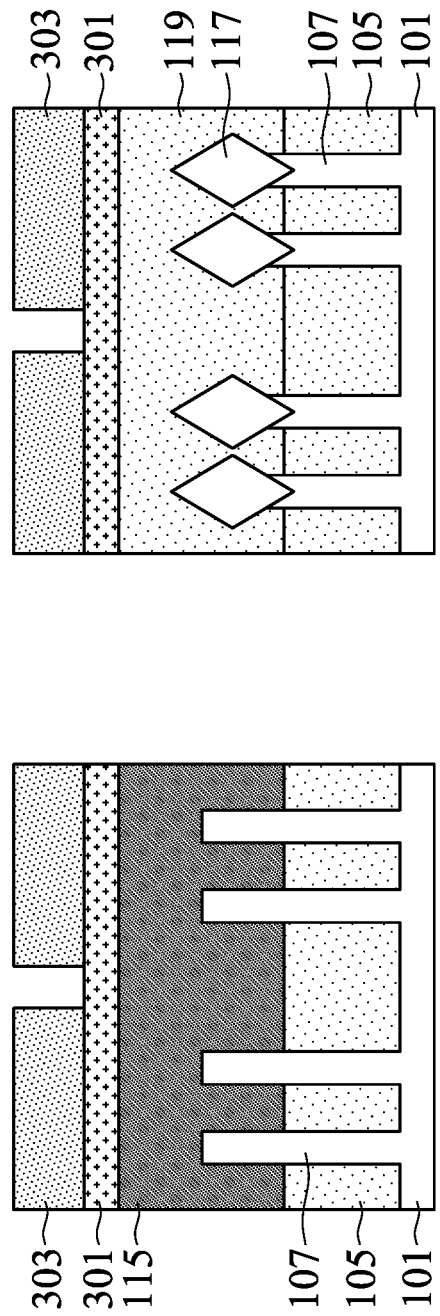
Figure 5A
Figure 5B
Figure 5C

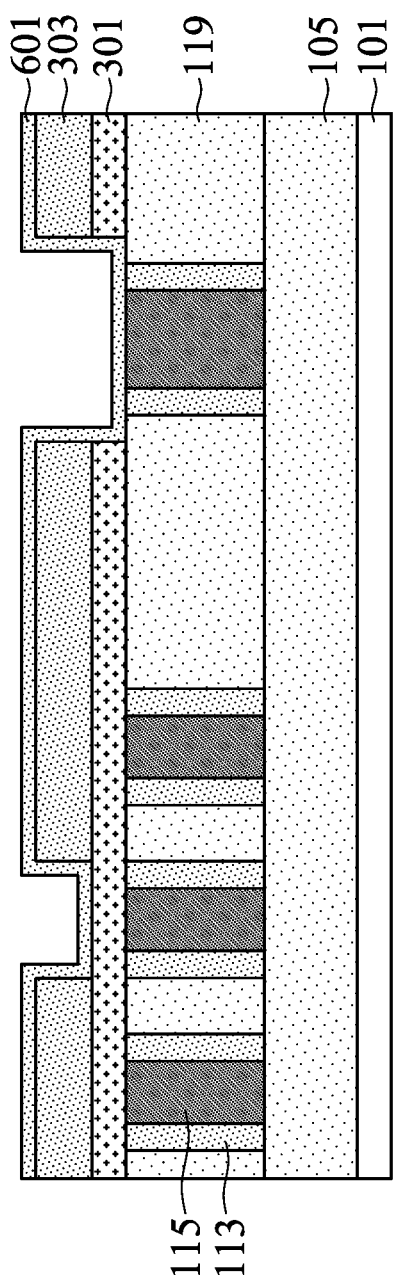
Figure 6A
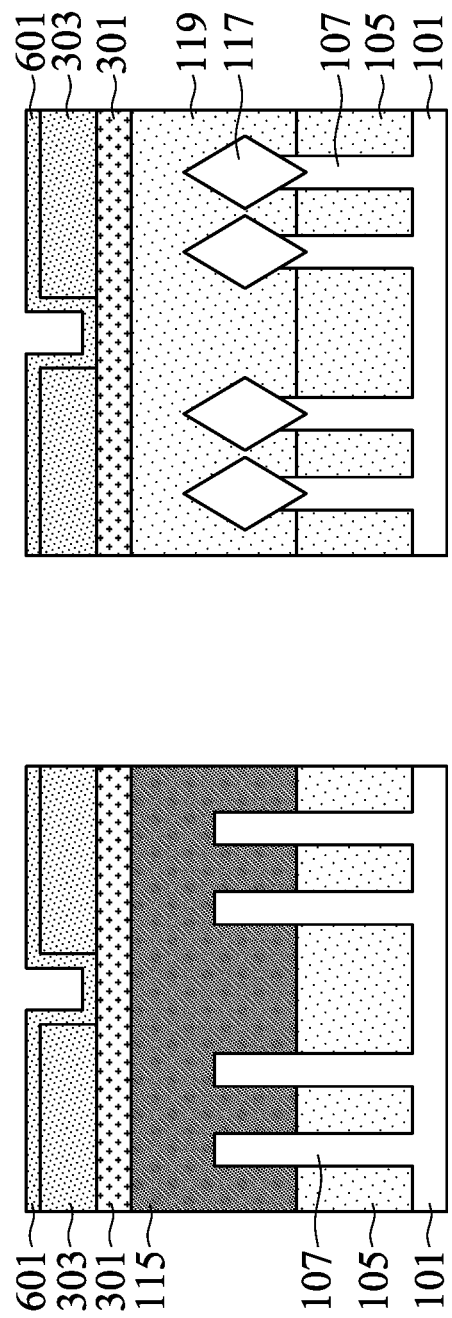
Figure 6B
Figure 6C

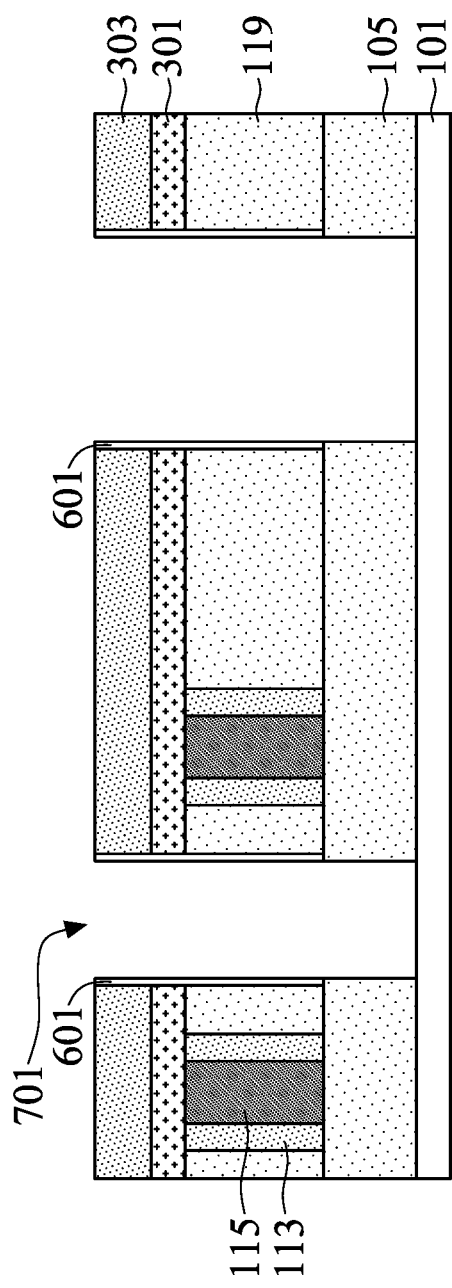
Figure 7A
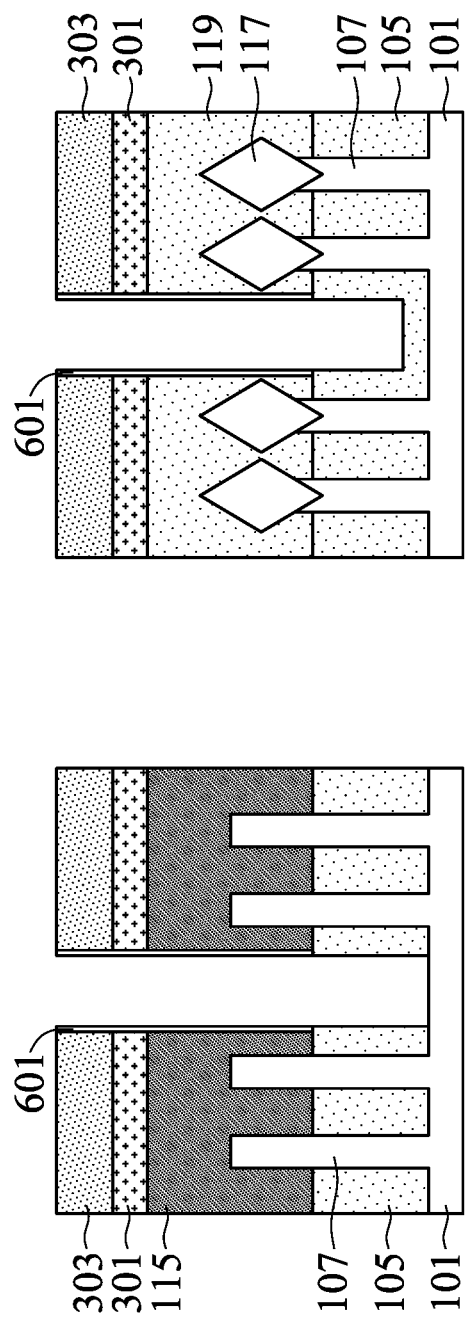
Figure 7B
Figure 7C

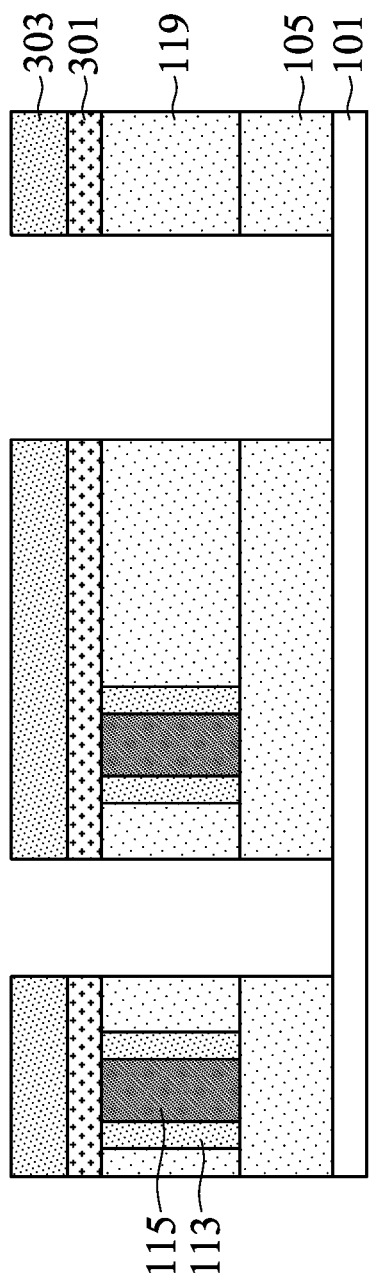
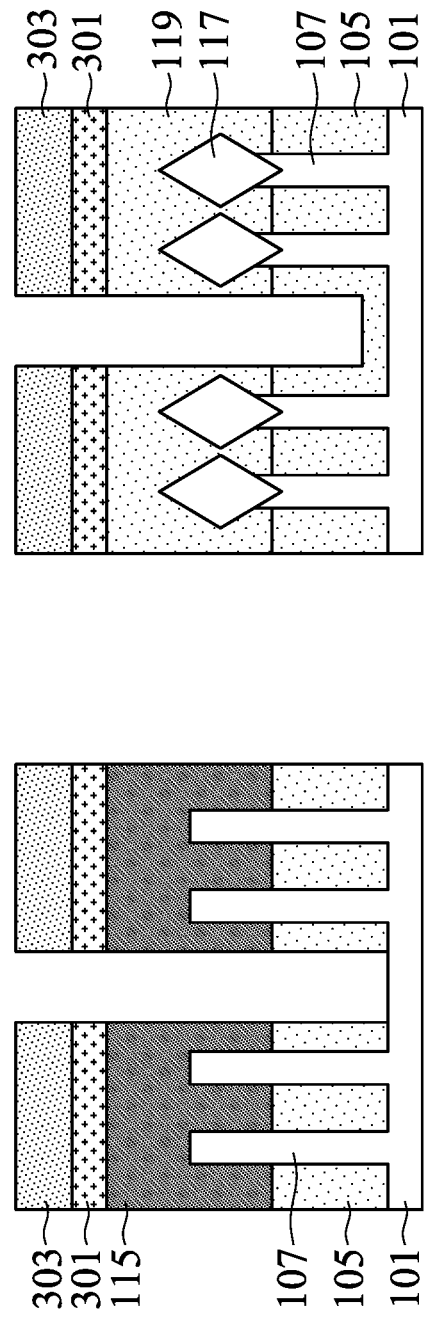
Figure 8A
Figure 8B
Figure 8C

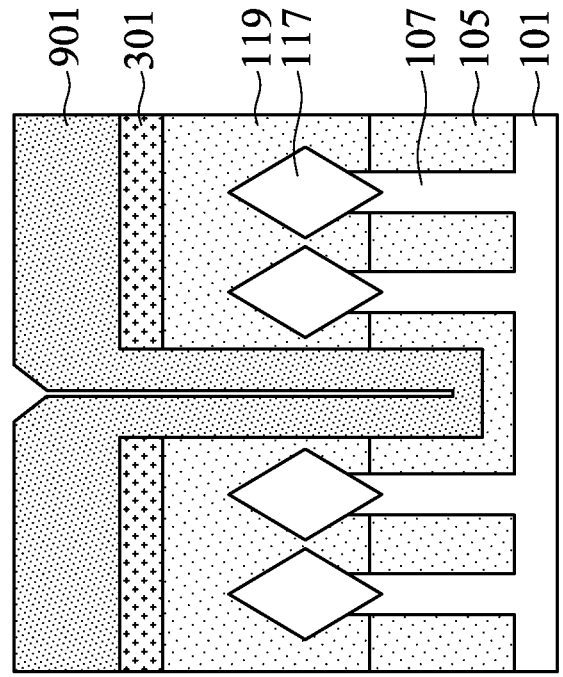
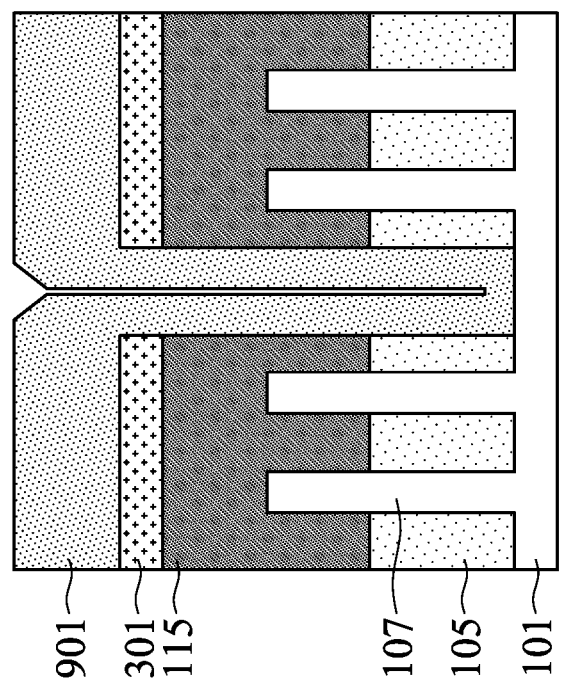
Figure 9C
Figure 9B

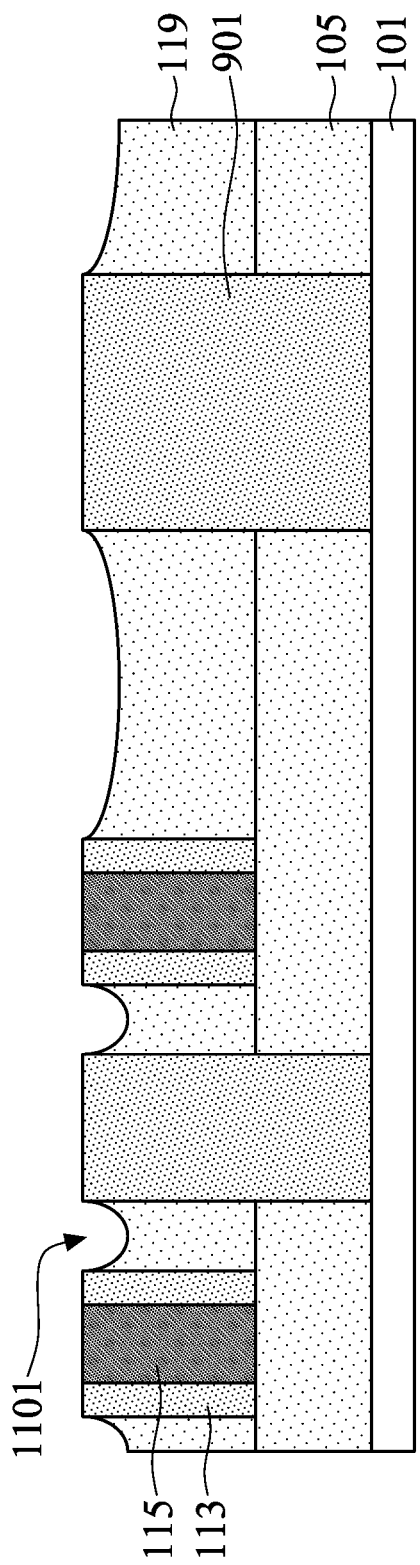
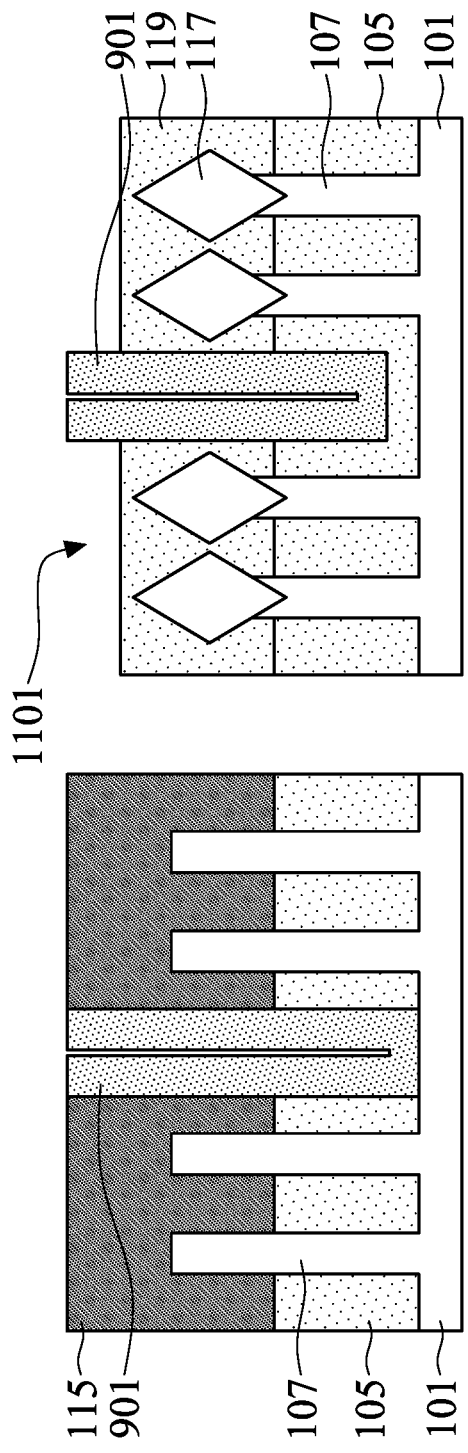
Figure 11A
Figure 11B
Figure 11C

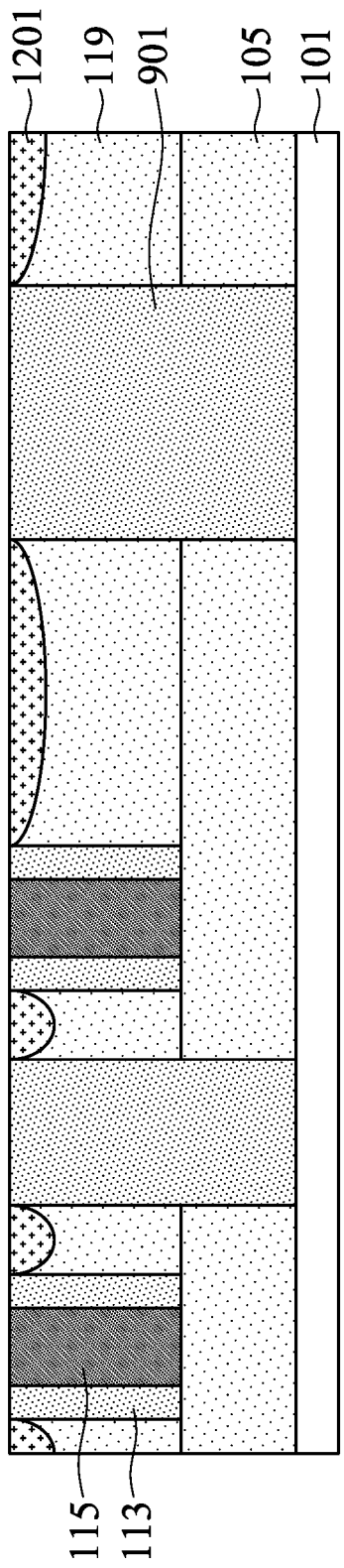
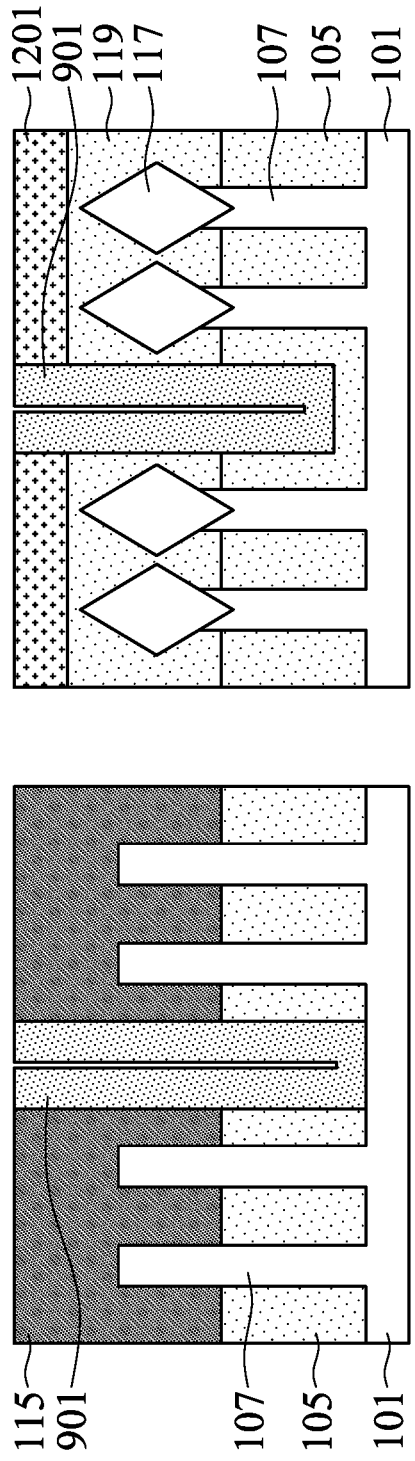
Figure 12A
Figure 12B
Figure 12C

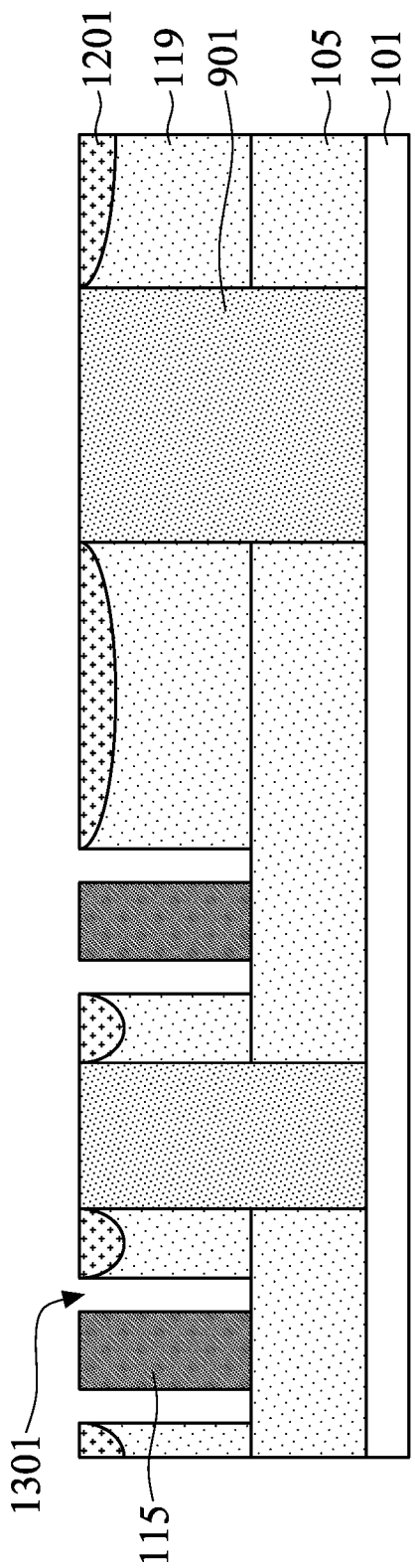
Figure 13A
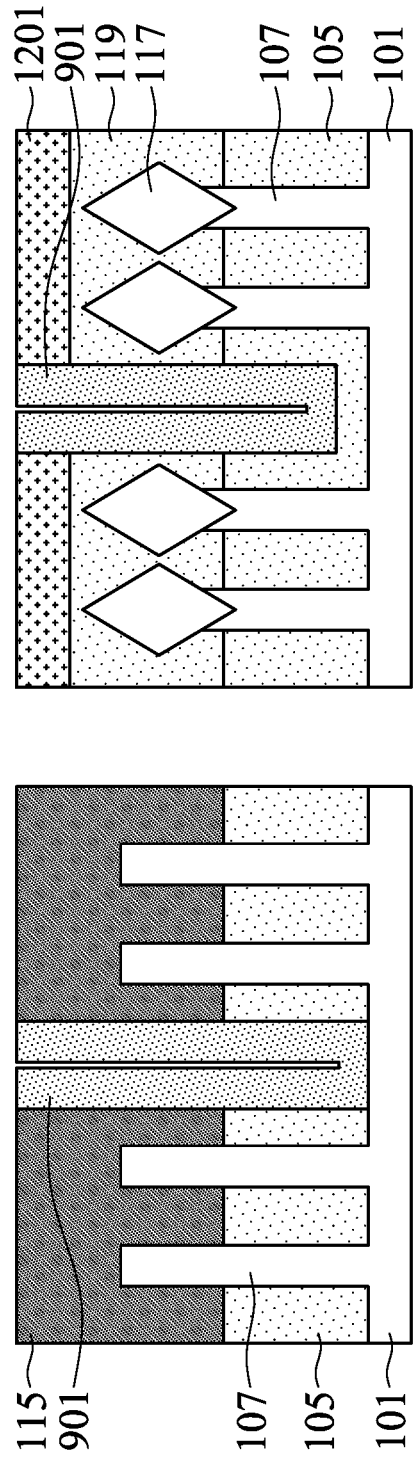
Figure 13B
Figure 13C

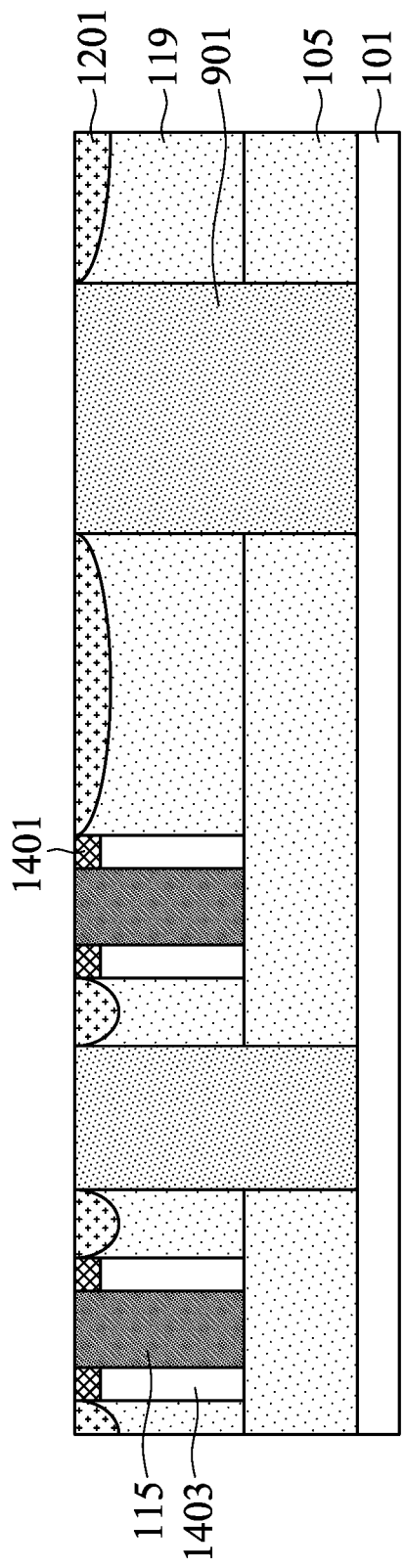
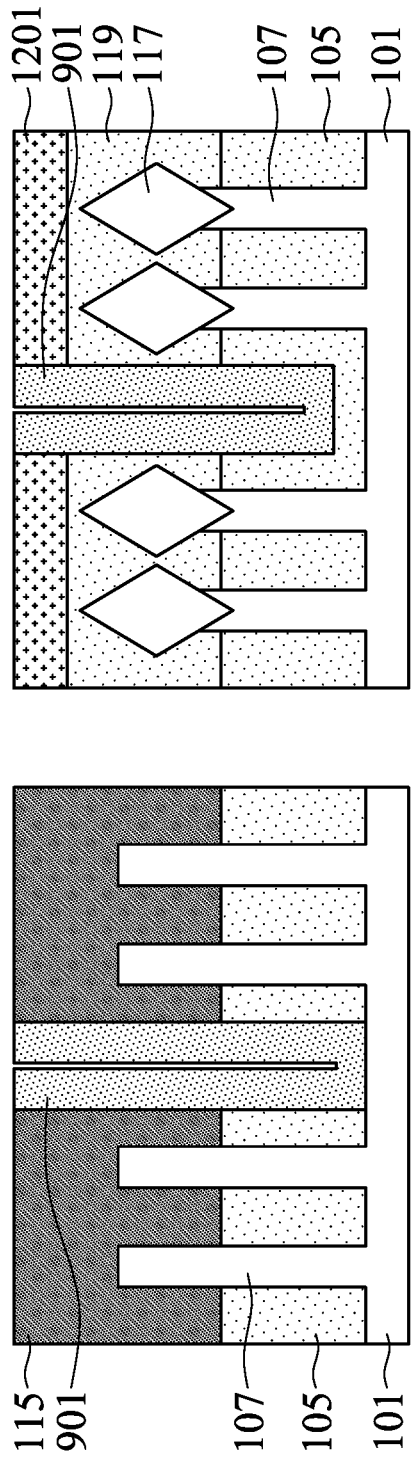
Figure 14A
Figure 14B
Figure 14C

METHOD OF MANUFACTURING A SEMICONDUCTOR DEVICE

PRIORITY CLAIM AND CROSS-REFERENCE

This application claims the benefit of U.S. Provisional Application No. 62/773,716, filed on Nov. 30, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C illustrate deposition of a first hard mask and a second hard mask in accordance with some embodiments.

FIGS. 5A-5C illustrate a patterning of the second hard mask in accordance with some embodiments.

FIGS. 6A-6C illustrate deposition of a liner in accordance with some embodiments.

FIGS. 7A-7C illustrate a resultant structure after an etching process in accordance with some embodiments.

FIGS. 8A-8E illustrate an oxide removal process in accordance with some embodiments.

FIGS. 9A-9C illustrate deposition of a fill material in accordance with some embodiments.

FIGS. 11A-11C illustrate a recessing process in accordance with some embodiments.

FIGS. 12A-12C illustrate a filling of the recesses in accordance with some embodiments.

FIGS. 13A-13C illustrate a removal of spacers in accordance with some embodiments.

FIGS. 14A-14C illustrate a capping process in accordance with some embodiments.

DETAILED DESCRIPTION

Figure 1:
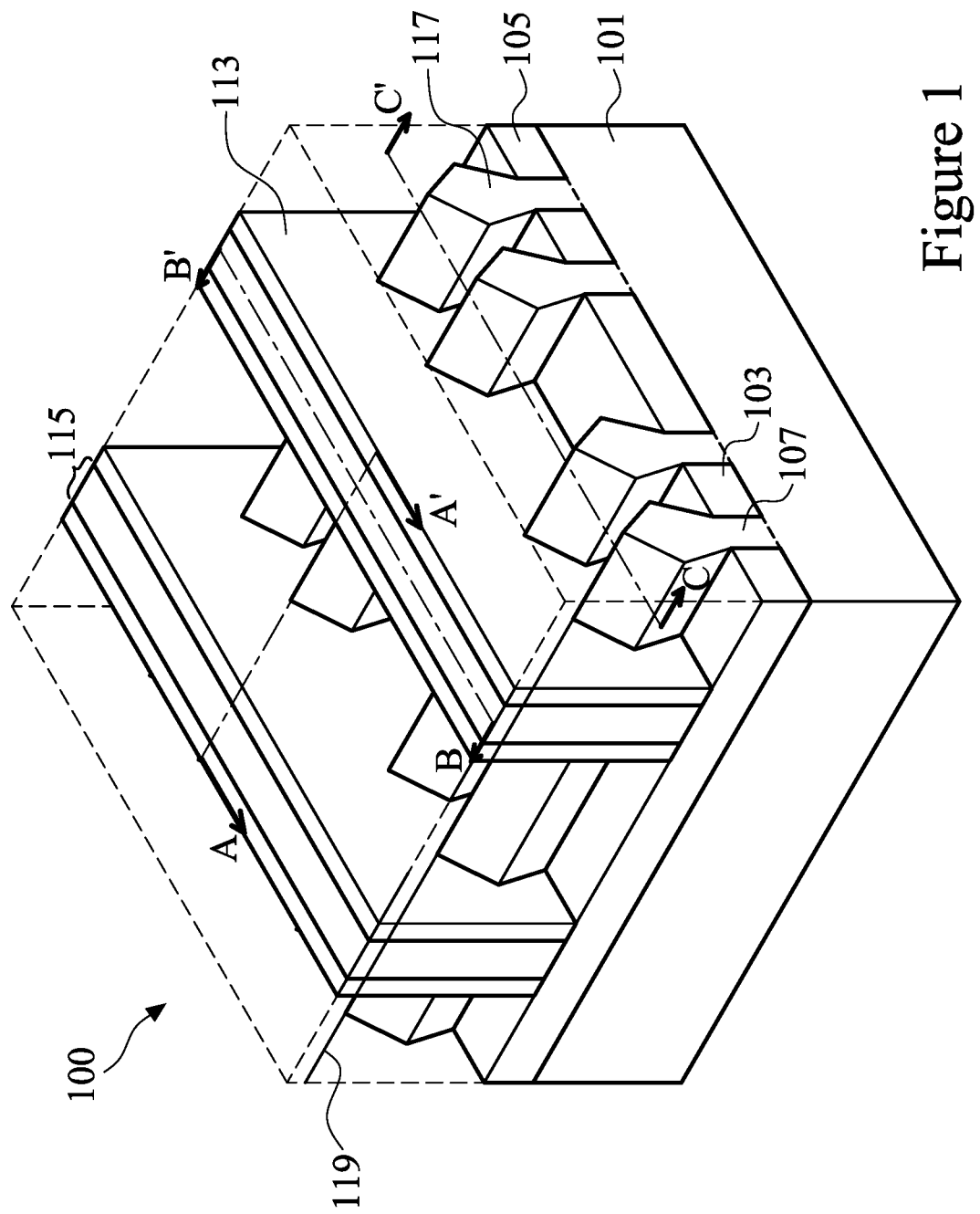
FIG. 1 illustrates metal gates over semiconductor fins in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below with respect to a process utilized to form air spacers within a cut metal gate process. However, the embodiments may be applicable to a large variety of applications, and are not limited to those embodiments described herein.

With reference now to FIG. 1, there is illustrated a perspective view of a semiconductor device 100 such as a finFET device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates four fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Additionally, while the above description provides one example embodiment, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. In one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 1000 Å, such as about 540 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric (or interface oxide), a dummy gate electrode over the dummy gate dielectric, and first spacers 113 may be formed over each of the fins 107. In an embodiment the dummy gate dielectric may be formed by thermal oxidation, chemical vapor deposition, sputtering, or any other methods known and used in the art for forming a gate dielectric. Depending on the technique of gate dielectric formation, the dummy gate dielectric thickness on the top of the fins 107 may be different from the gate dielectric thickness on the sidewall of the fins 107.

The dummy gate dielectric may comprise a material such as silicon dioxide or silicon oxynitride with a thickness ranging from about 3 angstroms to about 100 angstroms, such as about 10 angstroms. The dummy gate dielectric may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric.

The dummy gate electrode may comprise a conductive material and may be selected from a group comprising of polysilicon (e.g., a dummy polysilicon (DPO)), W, Al, Cu, AlCu, W, Ti, TiAlN, TaC, TaCN, TaSiN, Mn, Zr, TiN, Ta, TaN, Co, Ni, combinations of these, or the like. The dummy gate electrode may be deposited by chemical vapor deposition (CVD), sputter deposition, or other techniques known and used in the art for depositing conductive materials. The thickness of the dummy gate electrode may be in the range of about 5 Å to about 200 Å. The top surface of the dummy gate electrode may have a non-planar top surface, and may be planarized prior to patterning of the dummy gate electrode or gate etch. Ions may or may not be introduced into the dummy gate electrode at this point. Ions may be introduced, for example, by ion implantation techniques.

Once formed, the dummy gate dielectric and the dummy gate electrode may be patterned to form a series of stacks over the fins 107. The stacks define multiple channel regions located on each side of the fins 107 beneath the dummy gate dielectric. The stacks may be formed by depositing and patterning a gate mask (not separately illustrated in FIG. 1) on the dummy gate electrode using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode and the dummy gate dielectric may be etched using a dry etching process to form the patterned stacks.

Once the stacks have been patterned, the first spacers 113 may be formed. The first spacers 113 may be formed on opposing sides of the stacks. The first spacers 113 are typically formed by blanket depositing a spacer layer (not separately illustrated in FIG. 1) on the previously formed structure. The spacer layer may comprise SiCON, SiN, oxynitride, SiC, SiON, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 10 Å and about 100 Å. Additionally, once the first spacers 113 have been formed, a first spacer 113 adjacent to one stack may be separated from a first spacer 113 adjacent to another stack by a first distance of between about 50 Å and about 500 Å, such as about 200 Å. However, any suitable thicknesses and distances may be utilized.

Once the first spacers 113 have been formed, a removal of the fins 107 from those areas not protected by the stacks and the first spacers 113 and a regrowth of source/drain regions 117 may be performed. The removal of the fins 107 from those areas not protected by the stacks and the first spacers 113 may be performed by a reactive ion etch (RIE) using the stacks and the first spacers 113 as hardmasks, or by any other suitable removal process. The removal may be continued until the fins 107 are either planar with or below the surface of the first isolation regions 105.

Once these portions of the fins 107 have been removed, a hard mask (not separately illustrated), is placed and patterned to cover the dummy gate electrode to prevent growth thereon and the source/drain regions 117 may be regrown in contact with each of the fins 107. In an embodiment the source/drain regions 117 may be regrown and, in some embodiments the source/drain regions 117 may be regrown to form a stressor that will impart a stress to the channel regions of the fins 107 located underneath the stacks. In an embodiment wherein the fins 107 comprise silicon and the FinFET is a p-type device, the source/drain regions 117 may be regrown through a selective epitaxial process with a material, such as silicon, silicon germanium, silicon phosphorous, that has a different lattice constant than the channel regions. The epitaxial growth process may use precursors such as silane, dichlorosilane, germane, and the like, and may continue for between about 5 minutes and about 120 minutes, such as about 30 minutes. In other embodiments the source/drain regions 117 may comprise materials such as GaAs, GaP, GaN, InP, InAs, InSb, GaAsP, AlGaN, AlInAs, AlGaAs, GaInAs, GaInP, and/or GaInAsP; or combinations, or the like.

Once the source/drain regions 117 are formed, dopants may be implanted into the source/drain regions 117 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks and the first spacers 113 as masks. It should be noted that one of ordinary skill in the art will realize that many other processes, steps, or the like may be used to implant the dopants. For example, one of ordinary skill in the art will realize that a plurality of implantation processes may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode during the formation of the source/drain regions 117 is removed. In an embodiment the hard mask may be removed using, e.g., a wet or dry etching process that is selective to the material of the hard mask. However, any suitable removal process may be utilized.

FIG. 1 also illustrates a formation of an inter-layer dielectric (ILD) layer 119 (e.g., an ILD0 layer, represented in FIG. 1 using dashed lines to better illustrate the underlying structures). The ILD layer 119 may comprise a material such as silicon oxide ($SiO_2$) or boron phosphorous silicate glass (BPSG), although any suitable dielectrics may be used. The ILD layer 119 may be formed using a process such as PECVD, although other processes, such as LPCVD, may alternatively be used. The ILD layer 119 may be formed to a thickness of between about 100 Å and about 3,000 Å.

After the ILD layer 119 has been formed, the ILD layer 119 may be planarized in order to prepare the ILD layer 119 for further processing. In an embodiment the ILD layer 119 may be planarized using a planarization process such as chemical mechanical polishing (CMP) so that the ILD layer 119 is coplanar with the first spacers 113. However, any other suitable method, such as one or more etching processes, may also be utilized.

Once the ILD layer 119 has been planarized to expose the underlying dummy gate electrode, the dummy gate electrode and the dummy gate dielectric may then be removed. In an embodiment one or more etches, such as one or more wet etch processes, may be used to remove the dummy gate electrode and the dummy gate dielectric. However, any suitable removal process may be utilized.

Once the dummy gate electrode and dummy gate dielectric have been removed, the openings left behind may be refilled to form a gate stack 115. In a particular embodiment the gate stack 115 comprises a first dielectric material, a first metal material, a second metal material, and a third metal material. In an embodiment the first dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material may be deposited to a thickness of between about 5 Å and about 200 Å, although any suitable material and thickness may be utilized.

The first metal material may be formed adjacent to the first dielectric material and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The second metal material may be formed adjacent to the first metal material and, in a particular embodiment, may be similar to the first metal material. For example, the second metal material may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material may be deposited using a deposition process such as atomic layer deposition, chemical vapor deposition, sputtering, or the like, to a thickness of between about 5 Å and about 200 Å, although any suitable deposition process or thickness may be used.

The third metal material fills a remainder of the opening left behind by the removal of the dummy gate electrode. In an embodiment the third metal material is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode. In a particular embodiment the third metal material may be deposited to a thickness of between about 5 Å and about 500 Å, although any suitable material, deposition process, and thickness may be utilized.

Once the opening left behind by the removal of the dummy gate electrode has been filled, the materials may be planarized in order to remove any material that is outside of the opening left behind by the removal of the dummy gate electrode. In a particular embodiment the removal may be performed using a planarization process such as chemical mechanical polishing, until the gate stacks have a height over the fins 107 of between about 400 Å and about 600 Å, such as about 490 Å. However, any suitable planarization and removal process may be utilized.

Figure 2A:
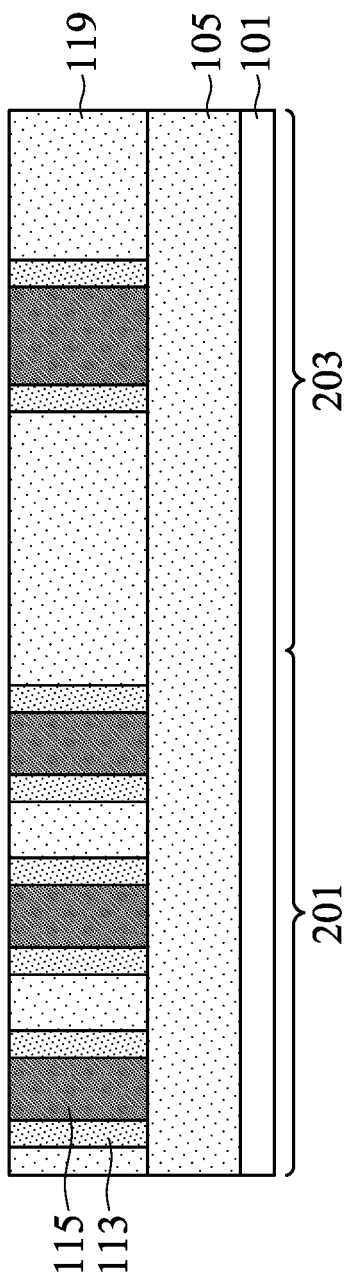
FIGS. 2A-2C illustrate cross-section views of FIG. 1, in accordance with some embodiments.
Figure 2C:
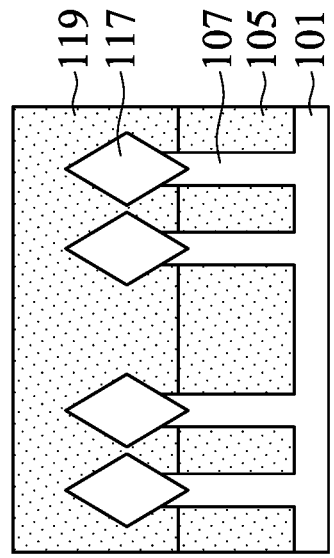
Figure 2B:
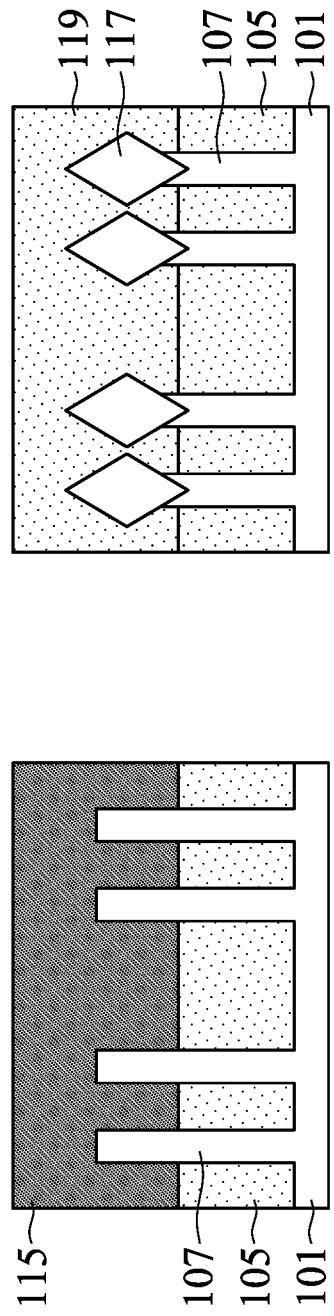

FIGS. 2A-2C illustrate different cross-sectional views of FIG. 1 along lines A-A', B-B' and C-C'. In particular, FIG. 2A illustrates a cross-sectional view taken along the length of the fin 107 in a first region 201 of the substrate 101, and illustrates the gate stacks 115 formed after the removal of the dummy gate electrode and dummy gate dielectric. FIG. 2A has also been expanded to show a second region 203 of the substrate 101 which has a gate stack 115 with different gate length. In one embodiment, the gate stacks 115 within the first region 201 have a first gate length GL1 of between about 400 Å and about 600 Å, such as about 500 Å, while the gate stacks 115 within the second region 203 have a second gate length GL2 of between about 1,000 Å and about 3,000 Å, such as about 2,000 Å. However, any suitable gate lengths may be utilized.

FIG. 2B illustrates a cross-sectional view of FIG. 1 taken along line B-B' and illustrates the fins 107 located beneath the gate stacks 115. As can be seen, a single gate stack 115 extends over multiple ones of the fins 107. Additionally, while four such fins 107 are illustrated, this number is intended to be illustrative and is not intended to be limiting in any fashion.

FIG. 2C illustrates a cross-sectional view of FIG. 1 taken along line C-C'. This view illustrates the view of the source/drain regions 117 in the first region 201 of the substrate 101. Additionally, while four such source/drain regions 117 are illustrated, this number is intended to be illustrative and is not intended to be limiting in any fashion.

FIGS. 3A-3C illustrate a formation of a first hard mask 301 and a second hard mask 303 over the structure. In an embodiment the first hard mask 301 is a material such as titanium nitride or tantalum nitride formed through a deposition process such as atomic layer deposition (ALD), chemical vapor deposition (CVD), or physical vapor deposition (PVD). The first hard mask 301 may be formed to a thickness of between about 3 nm and about 10 nm, such as about 5 nm. However, any suitable material, process of deposition, and thicknesses may be utilized.

Once the first hard mask 301 has been deposited, the second hard mask 303 may be deposited to cover the first hard mask 301. In an embodiment the second hard mask 303 may be a single layer of material or else may be one or more layers of material, such as a dual layer of materials. In an embodiment one layer or each layer of materials may comprise a material such as silicon nitride or silicon carbon nitride (SiCN). However, any suitable material or combination of materials may be utilized.

In an embodiment in which the second hard mask 303 comprises two sub-layers, the first sub-layer may be deposited using a deposition process such as ALD, CVD, or PVD to a thickness of between about 30 nm and about 40 nm, such as about 34 nm. Additionally, the second sub-layer may also be deposited using a deposition process such as ALD, CVD, or PVD to a thickness of between about 30 nm and about 40 nm, such as about 34 nm. However, any suitable deposition process and any suitable thicknesses may be utilized.

Optionally, if desired, after the second hard mask 303 has been formed, a surface treatment of the second hard mask 303 may be performed in order to help protect the second hard mask 303 and prepare the second hard mask 303 for additional processing. In an embodiment the surface treatment may be a descum treatment such as a plasma treatment wherein the surface of the second hard mask 303 is exposed to a plasma of, e.g., argon, nitrogen, oxygen or a mixed $Ar/N_2/O_2$ ambient environment in order to improve the interface adhesion between the second hard mask 303 and overlying layers. However, any suitable surface treatment may be utilized.

Figure 4A:
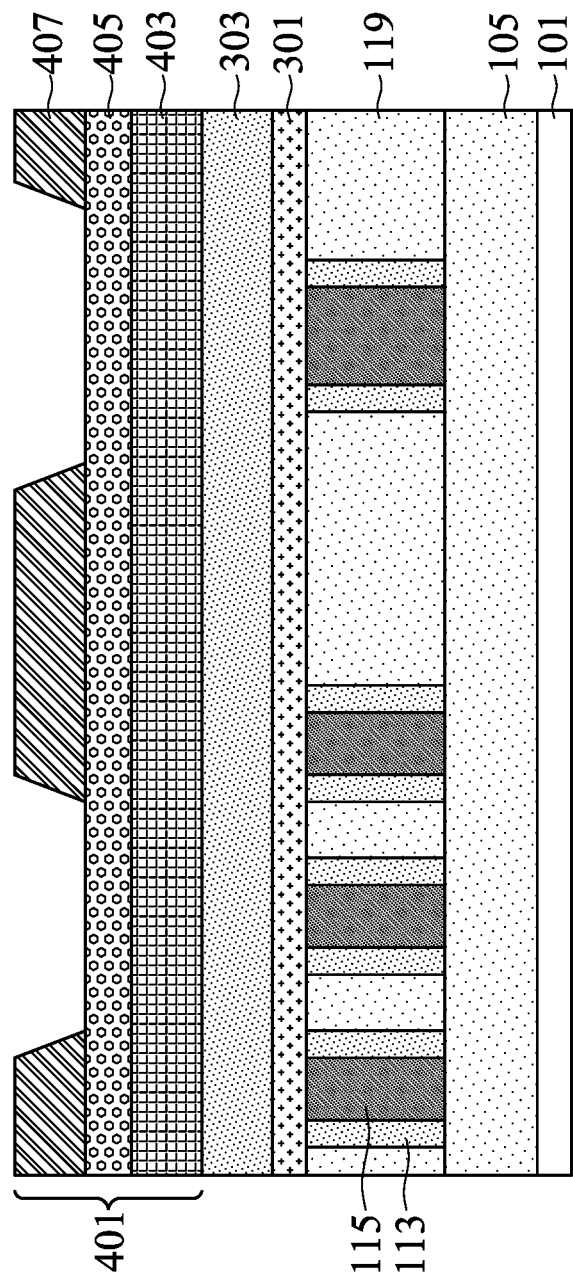
FIGS. 4A-4C illustrate placement and patterning of a photoresist in accordance with some embodiments.
Figure 4C:
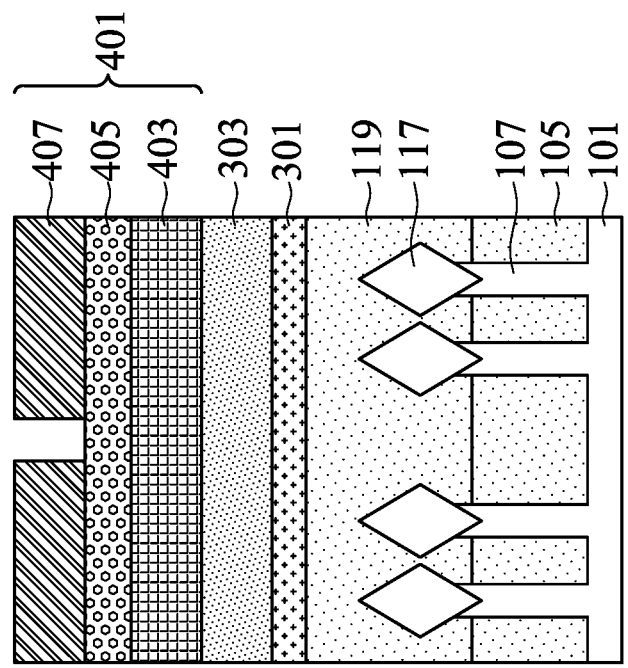
Figure 4B:
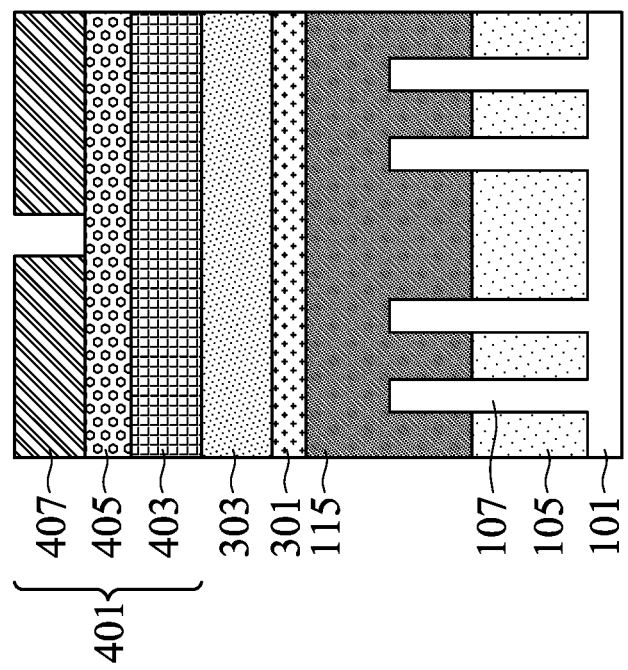

FIGS. 4A-4C illustrate that, after the optional surface treatment, the second hard mask 303 may be patterned in order to provide a masking layer for a subsequent etching process. In an embodiment the patterning of the second hard mask 303 may be initiated by placing a first photoresist 401 over the second hard mask 303 and then exposing and developing the first photoresist 401 to pattern the second hard mask 303. In an embodiment the first photoresist 401 is a tri-layer photoresist, with a bottom anti-reflective coating (BARC) layer 403, an intermediate mask layer 405, and a top photoresist layer 407. However, any suitable type of photosensitive material or combination of materials may be utilized.

FIGS. 5A-5B illustrate that once the first photoresist 401 has been patterned, the pattern of the first photoresist 401 is then transferred to the second hard mask 303. In an embodiment the transfer of the pattern can occur using, e.g., an anisotropic etching process such as a reactive ion etching process. However, any suitable process may be utilized.

Additionally, once the second hard mask 303 has been patterned, the first photoresist 401 may be removed. In an embodiment the top photoresist layer 407 may be removed using a thermal process such as ashing, whereby the temperature of the top photoresist layer 407 is increased until the top photoresist layer 407 undergoes a thermal decomposition and can be easily removed. Once the top photoresist layer 407 has been removed, the intermediate mask layer 405 and the bottom anti-reflective coating layer 403 may be removed using one or more etching processes.

If desired, a wet clean may be performed during or after the removal of the first photoresist 401. In an embodiment a solution such as an SC-1 or SC-2 cleaning solution may be utilized, although other solutions, such as a mixture of $H_2SO_4$ and $H_2O_2$ (known as SPM), or a solution of hydrogen fluoride (HF), may alternatively be utilized. Any suitable solution or process that may be used are fully intended to be included within the scope of the embodiments.

FIGS. 6A-6C illustrate a deposition of a masking layer 601 which is used to help initiate a cut metal gate process. In an embodiment the masking layer 601 may be made of a material that is similar to the material of the second hard mask 303. As such, in an embodiment in which the second hard mask 303 is formed of silicon nitride, the masking layer 601 may also be formed of silicon nitride. However, the masking layer 601 may also be made of different materials or different compositions from the second hard mask 303.

In an embodiment the masking layer 601 may be deposited using a deposition process such as atomic layer deposition, chemical vapor deposition, sputtering, combinations of these, or the like. Additionally, the masking layer 601 may be formed to a thickness of between about 3 nm and about 7 nm, such as about 5 nm. However, any suitable deposition process and any suitable thickness may be utilized.

FIGS. 7A-7B illustrates a continuation of the cut metal gate process that can be performed once the masking layer 601 has been deposited. In an embodiment the bottom portion of masking layer 601 may be removed in an anisotropic etching process. The vertical portions of masking layer 601 remain in the opening, and the width of the opening is reduced by the remaining portions of masking layer 601. Next, the underlying first hard mask 301 and the gate stack 115 are etched to form trench 701, which initially extends to an intermediate level of gate stack 115. The first spacers 113 and the exposed portions of ILD layer 119 are also etched.

In accordance with some embodiments of the present disclosure, the etching is performed using process gases selected from, and not limited to, $Cl_2$, $BCl_3$, Ar, $CH_4$, $CF_4$, and combinations thereof. The etching of gate stacks 115 may be performed with a pressure in the range between about 2.5 mTorr and about 25 mTorr. An RF power is applied in the main etching, and the RF power may be in the range between about 250 Watts and about 2,500 Watts. A bias voltage in the range between about 25 volts and about 750 volts may also be applied. The etching may be stopped when the bottom surface of the trench 701 is at an intermediate level between a top surface and a bottom surface of gate stack 115.

Subsequently, a second deposition process to reform the masking layer 601 is performed. The second deposition process to reform the masking layer 601 includes sidewall portions on the sidewalls of the trench 701 to protect the sidewalls, so that the upper portions of the trench 701 are not laterally expanded when the trench 701 is extended downwardly. In accordance with some embodiments of the present disclosure, the second deposition process to form the masking layer 601 is performed using process gases including $SiCl_4$, $O_2$, Ar, and the like. As such, the resulting masking layer 601 includes $SiO_2$ therein instead of, e.g., silicon nitride, which may or may not be compounded with additional elements such as carbon. The resulting masking layer 601 may be formed to have a thickness of between about 2 nm and about 4 nm, such as about 3 nm.

Next, a dielectric breaking process is performed, so that the bottom portion of the reformed masking layer 601 at the bottom of the trench 701 is removed in an anisotropic etching/bombardment process. In accordance with some embodiments, a carbon-and-fluorine gas (such as $C_4F_6$) is used to etch the bottom portion of the second masking layer. The thickness of the portion of masking layer 601 on the top surface of the masking layer 601 may be reduced during the etching process. The thickness of the portions of the masking layer 601 on the sidewalls of the trench 701 may also be reduced during the etching process.

Another etching process is performed to extend the trench 701 deeper into the gate stack 115. The etching is performed using an appropriate etching gas, depending on the material of the etched portion of gate stack 115. In accordance with some embodiments, a polymer such as $C_xH_y$ may be formed (with X and Y being integers) at the bottom of opening. The polymer may then be removed, for example, using oxygen ($O_2$).

In accordance with some embodiments, the etching of gate stack 115 includes a plurality of deposition-etching cycles, each including a dielectric-deposition process, a dielectric breaking process, an etching process to extend the trench 701 down, and possibly a polymer removal process. Each of the deposition-etching cycles results in the trench 701 extending further down, until gate stack 115 is etched through, and the trench 701 extends into first isolation region 105. In some embodiments, the process may be repeated two to ten times, although any suitable number of repetitions may be utilized. The resulting structure is shown in FIGS. 7A-7C. After the last etching process, no more dielectric layer is deposited, and hence in FIG. 7B, the bottom ends of masking layer 601 are higher than the bottom of the trench 701. The polymer layer, if any in trench 701, is removed.

Once the cut metal gate process has been completed, an optional rinsing process may be utilized to help clean any residual debris or reactants. In an embodiment a rinse using a material such as deionized water may be placed in contact with the structure. However, any suitable rinse process may be utilized.

Figure 8D:
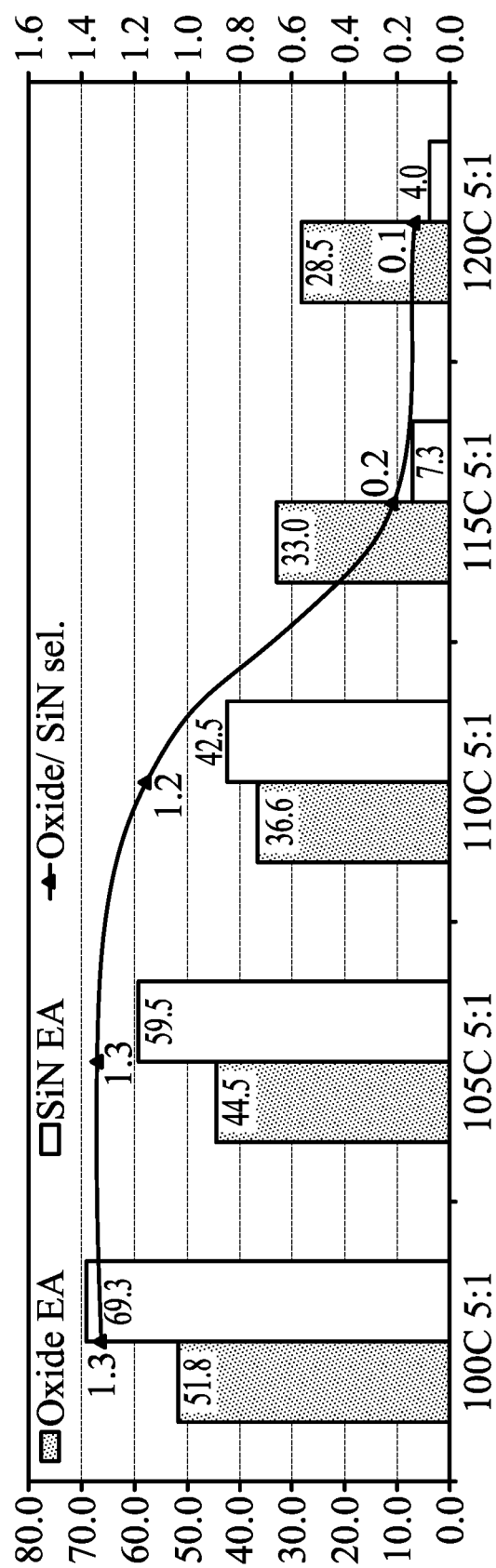

FIGS. 8A-8C illustrate a removal of the silicon oxide within the remnants of the masking layer 601. In one embodiment the removal of the silicon oxide from the masking layer 601 may be performed by introducing hydrogen fluoride (HF) and ammonia ($NH_3$) as etchants to the masking layer 601. The HF and $NH_3$ may react with each other and with the oxide present in the masking layer 60i to produce $(NH_4)_2SiF_6$ on a surface of the masking layer 601. In a particular embodiment the hydrogen fluoride and the ammonia may be flowed into the reaction chamber at a flow ratio of between about 1:5 and about 5:1 (with results of a 5:1 flow ratio being illustrated in FIG. 8D and wherein lower ranges will lead to an incomplete reaction), such as flowing the hydrogen fluoride into the reaction chamber at a flow rate of between about 100 sccm and 800 sccm such as about 200 sccm, while flowing the ammonia into the reaction chamber at a flow rate of between about 50 sccm and 300 sccm such as about 100 sccm. However, any suitable flow rates and ratios may be utilized.

Under these conditions, the process temperature may be selected in order to help increase the selectivity of the reaction. As illustrated in FIG. 8D, while the temperature of the process may be set to be between about 30° C. and about 120° C., a temperature above 110° C., such as between about 115° C. and about 120° C., will help to modify the activation energies (e.g., "EAs") of the etching process and, hence, the selectivity of the etching process to primarily etch the oxide that is present while only minimally removing the surrounding material (e.g., silicon nitride). However, any suitable temperature may be chosen.

Figure 8E:
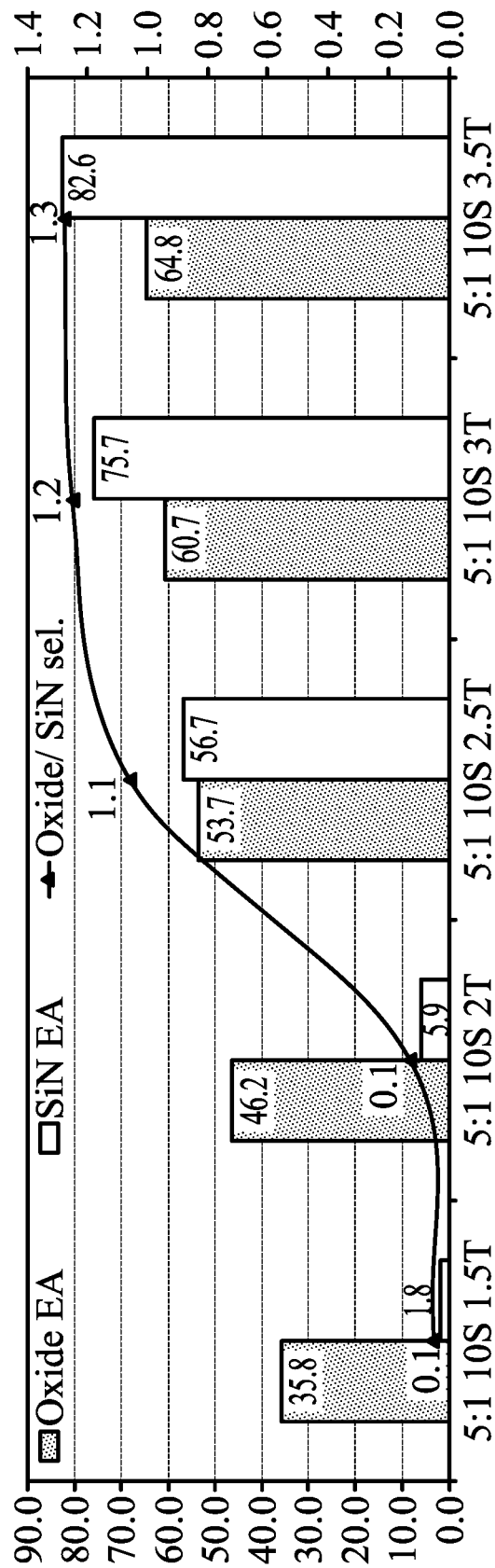

Similarly under these conditions, the process pressure may also be selected in order to help increase the selectivity of the reaction. As illustrated in FIG. 8E, while the pressure of the process may be set to be between about 0.1 Torr and about 5 Torr, a pressure of less than 2.5 Torr, such as between about 1.5 Torr and about 2 Torr, will help to modify the selectivity of the etching process to primarily etch the oxide that is present while only minimally removing the surrounding material (e.g., silicon nitride). However, any suitable pressure may be chosen.

To determine when the reaction has completed, a timing of the process may be utilized. In some embodiments the reaction may be continued for a time of between about 1 second and about 5 seconds, such as about 2 seconds. However, any suitable time and any suitable method for deciding when to stop the etching process may be utilized.

Once the reaction has completed, the masking layer 601 may be heated using an annealing process in order to remove the $(NH_4)_2SiF_6$, thereby removing the silicon oxide from the masking layer 601. The heat may cause the $(NH_4)_2SiF_6$ to thermally decompose to $N_2$, $H_2O$, $SiF_4$, and $NH_3$, all of which may be vapor and may be removed from the surface of the masking layer 601 by the annealing process. In an embodiment of the annealing process the masking layer 601 may be heated to a temperature of between about 80° C. to about 200° C., such as about 100° C. for between about 60 seconds to about 180 seconds to remove the $(NH_4)_2SiF_6$ from the masking layer 601.

After the $(NH_4)_2SiF_6$ has been removed, the masking layer 601 is again exposed and may be further processed. In an embodiment a second etching process, such as a second etch process similar to the first etch process described above, may be performed to remove any remaining residual silicon oxide. However, as one of ordinary skill in the art will recognize, the precise type of etching process, the number of iterations of the CERTAS® process, and the process parameters for the etching process, as described above are intended to be illustrative only, as any number of iterations and process parameters may be utilized.

Optionally, after the removal of the oxide, a second wet clean may be performed to prepare the structure for subsequent processing. In an embodiment a solution such as an SC-1 or SC-2 cleaning solution may be utilized, although other solutions, such as a mixture of $H_2SO_4$ and $H_2O_2$ (known as SPM), or a solution of hydrogen fluoride (HF), may alternatively be utilized. Any suitable solution or process that may be used are fully intended to be included within the scope of the embodiments.

Figure 9A:
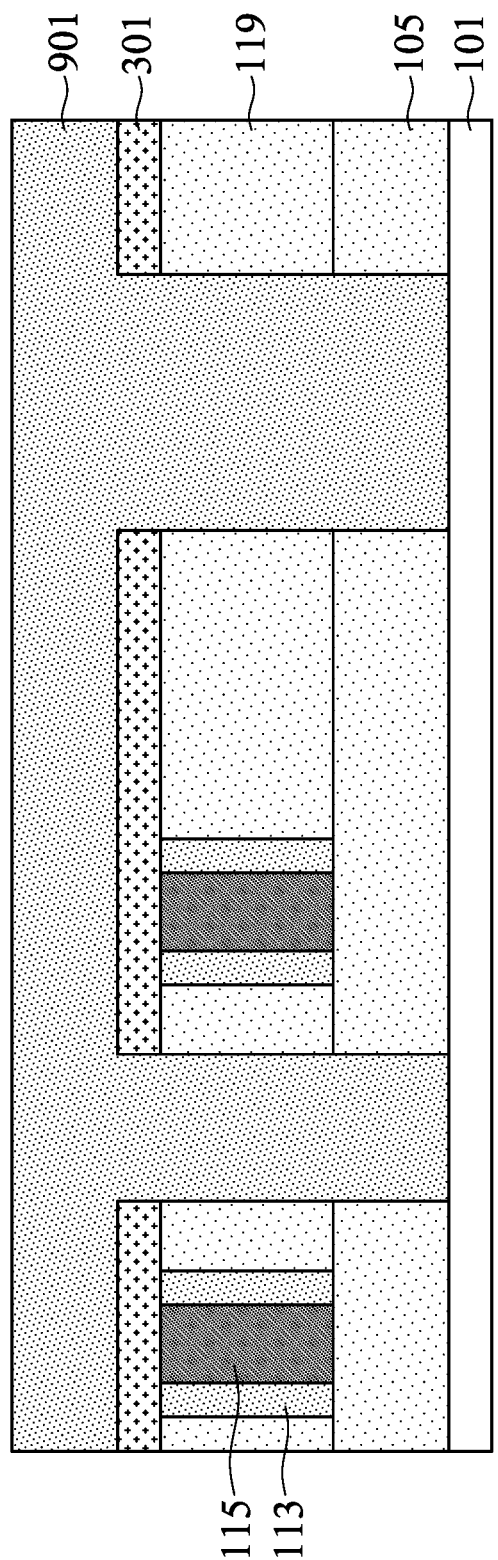

FIGS. 9A-9B illustrate a filling of the trenches 701 with a fill material 901 to finish the separation of the gate stack 115. In an embodiment the fill material 901 may be a single layer of material or else may be one or more layers of material, such as a dual layer of materials. In an embodiment one layer or each layer of materials may comprise a material such as silicon nitride or silicon carbon nitride (SiCN). However, any suitable material or combination of materials may be utilized.

In an embodiment the fill material 901 may be deposited using a deposition process such as ALD, CVD, or PVD to a thickness of between about 20 nm and about 30 nm, such as about 25 nm. However, any suitable deposition process and any suitable thicknesses may be utilized for the fill material 901.

Figure 10A:
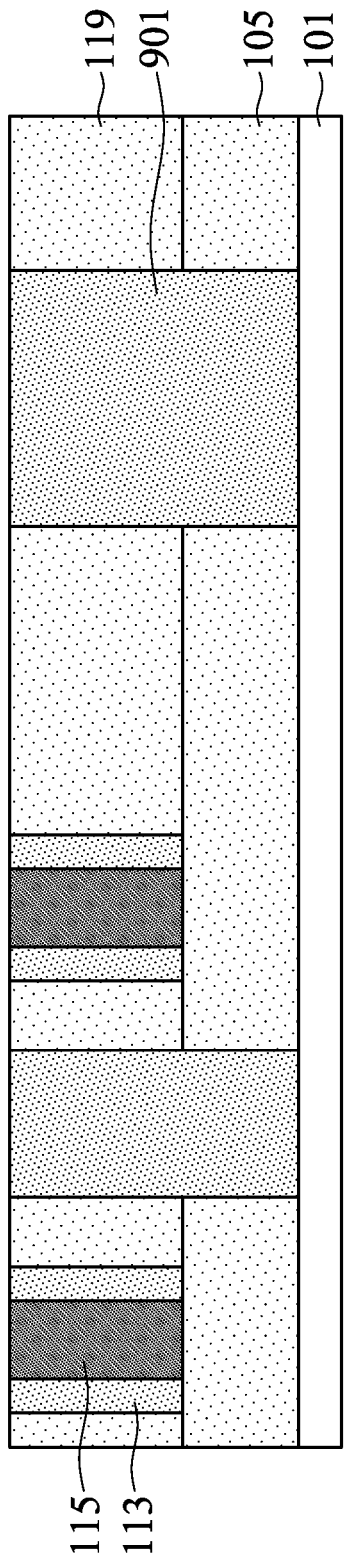
FIGS. 10A-10C illustrate a planarization process in accordance with some embodiments.
Figure 10B:
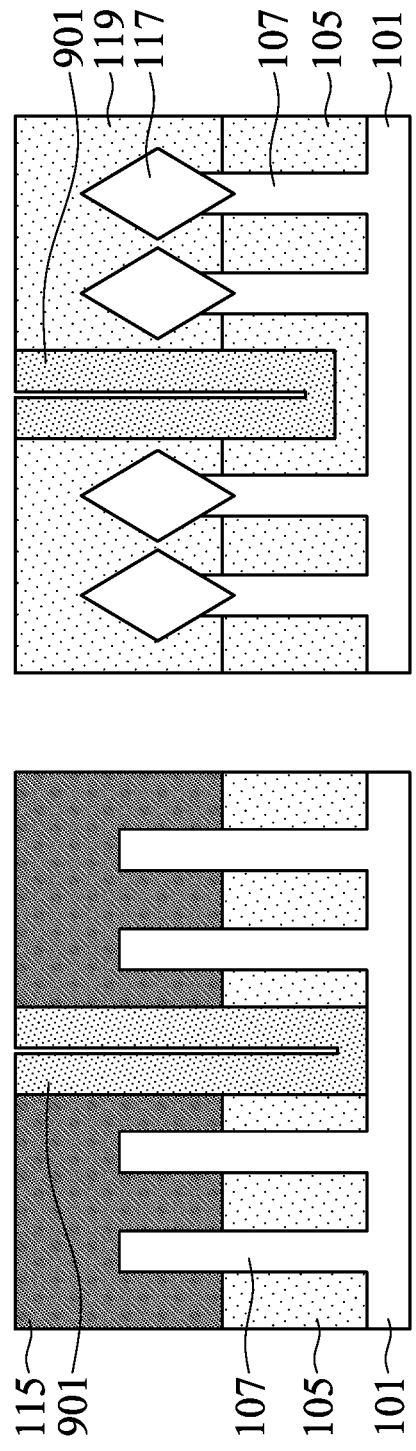
Figure 10C:
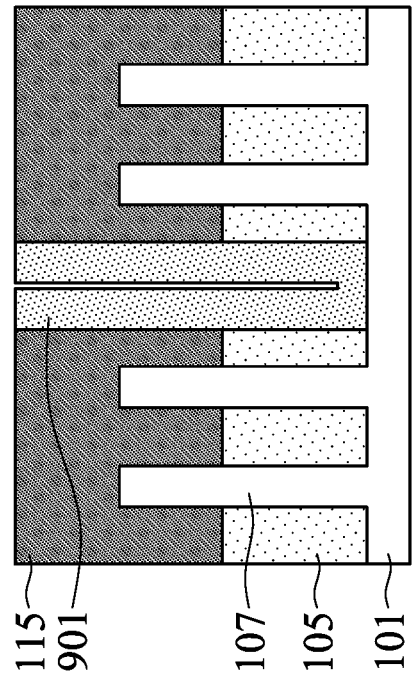

FIGS. 10A-10C illustrate a planarization of the fill material 901 and a removal of the first hard mask 301. In an embodiment the planarization may be a process such as a chemical mechanical polishing process which is utilized to planarize the fill material 901 with the gate stacks 115 and the first spacers 113. During the process the first hard mask 301 is also removed.

Additionally, the chemical mechanical polishing process that is used to remove excess fill material 901 may be also be utilized to reduce the height of the gate stacks 115 at this time. In an embodiment the height of the gate stacks 115 over the fins 107 may be reduced to a height of between about 200 Å and about 400 Å. However, any suitable reduction of height may be utilized.

FIGS. 11A-11C illustrate a recessing of the ILD layer 119 to form recesses 1101 in preparation for formation of a dielectric helmet. In an embodiment the ILD layer 119 may be recessed using one or more etching processes, such as a wet etching process to a depth of between about 10 nm and about 30 nm, such as about 20 nm. However, any suitable depth may be utilized.

FIGS. 12A-12C illustrate a deposition of a helmet material 1201 and subsequent planarization process. In an embodiment the helmet material 1201 may be a dielectric material such as silicon oxycarbide (SiOC) or silicon and the helmet material 1201 may be deposited to fill and/or overfill the recesses formed by the recessing of the ILD layer 119 using a deposition process such as chemical vapor deposition, atomic layer deposition, or sputtering. However, any suitable materials and deposition processes may be utilized.

Subsequent to the deposition of the helmet material 1201, a planarization of the helmet material 1201 is performed. In an embodiment the planarization may be a process such as a chemical mechanical polishing process which is utilized to planarize the helmet material 1201 with the gate stack 115 and the first spacers 113.

Additionally, the chemical mechanical polishing process that is used to planarize the helmet material 1201 may be also be utilized to reduce the height of the gate stacks 115 at this time. In an embodiment the height of the gate stacks 115 over the fins 107 may be reduced to a height of between about 200 Å and about 300 Å. However, any suitable reduction of height may be utilized.

FIGS. 13A-13C illustrate a removal of the first spacers 113 and the formation of a void 1301 around the gate stacks 115. In an embodiment a photoresist may be placed and patterned to protect those areas where removal is not desired, and then one or more etching process may be utilized to partially or fully remove the first spacers 113 and form voids 1301 where the first spacers 113 had previously resided. In one particular embodiment a wet etching process selective to the material or materials of the first spacers 113 may be utilized to remove the first spacers 113 without significantly removing the surrounding materials.

However, because any residual oxygen along the sidewalls of the gate stacks 115 has been previously removed prior to the filling of the trenches (as discussed above with respect to FIGS. 8A-8E), this oxygen is not present during the removal of the first spacers 113. In particular, in previous processes in which the residual oxygen is still present between the fill material 901 and the ILD layer 119, the etching and removal of the first spacers 113 would also attack and remove the residual oxygen, opening up a pathway between the fill material 901 and the ILD layer 119. This pathway would allow the etchants to extend to and attack the underlying isolation region 105.

However, because the currently described process removes the residual oxygen that was present prior to the formation of the fill material 901, the fill material 901 will be formed to make direct contact with the material of the ILD layer 119, forming a seal that does not include the residual oxygen. Accordingly, during the removal process of the first spacers 113, there is no oxygen to be removed between the fill material 901 and the ILD layer 119, and no open pathway occurs. This prevention of formation of the pathway prevents any of the etchants that are used during the removal of the first spacers 113 from penetrating to the underlying first isolation region 105 and removing material from the first isolation region 105. By preventing this pathway and reducing the damage from this pathway, the time limitations that were previously present during the etching of the first spacers 113 to prevent such penetration can be removed, thereby widening the overall process window for the removal of the first spacers 113 and the formation of the air spacers 1403 (illustrated further below with respect to FIGS. 14A-14C) is enlarged.

FIGS. 14A-14C illustrate a deposition of a cap layer 1401 and formation of an air spacer 1403 adjacent to the gate stacks 115. In an embodiment the cap layer 1401 can be an appropriate dielectric material, which may further be a low-k dielectric layer that has a dielectric constant (k) value less than 3.9, which may further be less than 2.0. In some embodiments, the dielectric material of the cap layer 1401 is silicon nitride (SiN), silicon carbon oxynitride (SiCON), silicon oxycarbide (SiOC), or the like. The cap layer 1401 can be formed using an appropriate deposition technique, such as ALD, CVD, or the like. If the aspect ratio of the openings is sufficiently high, the deposition will seal off the void formed by the removal of the first spacers 113 and form the air spacer 1403. A gas, such as a gas(es) used during the deposition of the dielectric material of the cap layer 1401 or any other species that can diffuse into air spacer 1403, may be in the air spacers 1403.

A planarization process, such as a CMP, may be performed to remove excess dielectric material of the cap layer 1401 from the top surfaces of the helmet material 1201 and the gate stacks 115. As such, the cap layer 1401 may be planar with both the helmet material 1201 as well as the gate stacks 115.

Additionally, the chemical mechanical polishing process that is used to remove excess dielectric material of the cap layer 1401 may be also be utilized to reduce the height of the gate stacks 115 at this time. In an embodiment the height of the gate stacks 115 over the fins 107 may be reduced to a height of between about 140 Å and about 160 Å. However, any suitable reduction of height may be utilized.

By removing residual oxygen from previous processes prior to the removal of the first spacers 113 to form the air spacers 1403, this oxygen is not present and cannot be removed during the removal of the first spacers 113. As such, no pathway can be formed that allows the etchants to penetrate into undesired areas of the structure, where the etchants can cause further damage. This allows for a widening of the process window for the removal of the first spacers 113 and helps to improve the overall efficiency and yield of the manufacturing process.

In an embodiment, a method of manufacturing a semiconductor device includes: forming a metal gate over a semiconductor fin; cutting the metal gate into a first metal gate and a second metal gate, wherein after the cutting the metal gate, an oxide is present on a sidewall of the first metal gate; removing the oxide from the sidewall of the first metal gate; and filling a region between the first metal gate and the second metal gate with a dielectric material, wherein the dielectric material is in physical contact with the sidewall of the first metal gate. In an embodiment the method further includes removing a spacer from a second sidewall of the first metal gate after the removing the oxide from the sidewall, the removing the spacer creating a void. In an embodiment the method further includes capping the void to form an air spacer. In an embodiment the removing the oxide is performed at a temperature between about 115° C. and about 120° C. In an embodiment the removing the oxide is performed at a pressure of between about 1.5 Torr and about 2 Torr. In an embodiment the removing the oxide is performed at least in part with a mixture of hydrogen fluoride and ammonia. In an embodiment the cutting the metal gate is performed at least in part with cyclic deposition and etch processes.

In another embodiment a method of manufacturing a semiconductor device includes removing a dummy gate between spacers over a semiconductor fin; replacing the dummy gate with a gate stack; removing a portion of the gate stack with a cyclical etching process to form an opening, the cyclical etching process leaving an oxide material along sidewalls of the opening; removing the oxide material from along the sidewalls of the opening; after the removing the oxide material, filling the opening with a dielectric material; applying an etchant to the spacers and also to a portion of an interface between the dielectric material and the gate stack, wherein the etchant removes the spacers to form a void but does not interject between the dielectric material and the gate stack; and capping the void to form an air spacer adjacent to the gate stack. In an embodiment the method further includes after the filling the opening with the dielectric material, recessing an interlayer dielectric to form a recess. In an embodiment the method further includes filling the recess with a second dielectric material. In an embodiment each cycle of the cyclical etching process comprises: depositing a liner material; etching through the liner material; and using the liner material as a mask to etch the gate stack. In an embodiment the removing the oxide material is performed at a temperature between about 115° C. and about 120° C. In an embodiment the removing the oxide material is performed at a pressure of between about 1.5 Torr and about 2 Torr. In an embodiment the removing the oxide material is performed at least in part with a mixture of hydrogen fluoride and ammonia.

In yet another embodiment a method of manufacturing a semiconductor device includes: patterning a hard mask layer to form an opening over a conductive gate over a semiconductor fin; depositing a first liner in the opening; etching a first bottom of the first liner to expose the conductive gate;

etching the conductive gate through the first liner; depositing a second liner within the opening; etching a second bottom of the second liner to expose the conductive gate; etching the conductive gate through the second liner; removing an oxide from a sidewall of the conductive gate after the etching the conductive gate; applying a dielectric material to the sidewall of the conductive gate after the removing the oxide; after the applying the dielectric material to the sidewall, removing spacers from adjacent to the conductive gate to form a void around the conductive gate; and capping the void to form air spacers around the conductive gate. In an embodiment the removing the oxide from the sidewall is performed at least in part with a mixture of hydrogen fluoride and ammonia. In an embodiment the removing the oxide further comprises an annealing process. In an embodiment the annealing process is performed at a temperature of between about 80° C. to about 200° C. In an embodiment the removing the oxide is performed at a pressure of between about 1.5 Torr and about 2 Torr. In an embodiment the method further includes: recessing an interlayer dielectric to form a recess; and filling the recess with a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a metal gate over a semiconductor fin;
    cutting the metal gate into a first metal gate and a second metal gate, wherein after the cutting the metal gate, an oxide is present on a sidewall of the first metal gate;
    removing the oxide from the sidewall of the first metal gate; and
    filling a region between the first metal gate and the second metal gate with a dielectric material, wherein the dielectric material is in physical contact with the sidewall of the first metal gate.

2. The method of claim 1, further comprising removing a spacer from a second sidewall of the first metal gate after the removing the oxide from the sidewall, the removing the spacer creating a void.

3. The method of claim 2, further comprising capping the void to form an air spacer.

4. The method of claim 1, wherein the removing the oxide is performed at a temperature between 115° C. and 120° C.

5. The method of claim 4, wherein the removing the oxide is performed at a pressure of between 1.5 Torr and 2 Torr.

6. The method of claim 1, wherein the removing the oxide is performed at least in part with a mixture of hydrogen fluoride and ammonia.

7. The method of claim 1, wherein the cutting the metal gate is performed at least in part with cyclic deposition and etch processes.

8. A method of manufacturing a semiconductor device, the method comprising:
    removing a dummy gate between spacers over a semiconductor fin;
    replacing the dummy gate with a gate stack;
    removing a portion of the gate stack with a cyclical etching process to form an opening, the cyclical etching process leaving an oxide material along sidewalls of the opening;
    removing the oxide material from along the sidewalls of the opening;
    after the removing the oxide material, filling the opening with a dielectric material;
    applying an etchant to the spacers and also to a portion of an interface between the dielectric material and the gate stack, wherein the etchant removes the spacers to form a void but does not interject between the dielectric material and the gate stack; and
    capping the void to form an air spacer adjacent to the gate stack.

9. The method of claim 8, further comprising after the filling the opening with the dielectric material, recessing an interlayer dielectric to form a recess.

10. The method of claim 9, further comprising filling the recess with a second dielectric material.

11. The method of claim 8, wherein each cycle of the cyclical etching process comprises:
    depositing a liner material;
    etching through the liner material; and
    using the liner material as a mask to etch the gate stack.

12. The method of claim 8, wherein the removing the oxide material is performed at a temperature between 115° C. and 120° C.

13. The method of claim 12, wherein the removing the oxide material is performed at a pressure of between 1.5 Torr and 2 Torr.

14. The method of claim 13, wherein the removing the oxide material is performed at least in part with a mixture of hydrogen fluoride and ammonia.

15. A method of manufacturing a semiconductor device, the method comprising:
    patterning a hard mask layer to form an opening over a conductive gate over a semiconductor fin;
    depositing a first liner in the opening;
    etching a first bottom of the first liner to expose the conductive gate;
    etching the conductive gate through the first liner;
    depositing a second liner within the opening;
    etching a second bottom of the second liner to expose the conductive gate;
    etching the conductive gate through the second liner;
    removing an oxide from a sidewall of the conductive gate after the etching the conductive gate through the second liner;
    applying a dielectric material to the sidewall of the conductive gate after the removing the oxide;
    after the applying the dielectric material to the sidewall, removing spacers from adjacent to the conductive gate to form a void around the conductive gate; and
    capping the void to form air spacers around the conductive gate.

16. The method of claim 15, wherein the removing the oxide from the sidewall is performed at least in part with a mixture of hydrogen fluoride and ammonia.

17. The method of claim 16, wherein the removing the oxide further comprises an annealing process.

18. The method of claim 17, wherein the annealing process is performed at a temperature of between 80° C. to 200° C.

19. The method of claim 18, wherein the removing the oxide is performed at a pressure of between 1.5 Torr and 2 Torr.

20. The method of claim 15, further comprising:
recessing an interlayer dielectric to form a recess; and
filling the recess with a dielectric material.

\* \* \* \* \*